United States Patent
Gregorich et al.

(10) Patent No.: US 9,437,512 B2
(45) Date of Patent: Sep. 6, 2016

(54) INTEGRATED CIRCUIT PACKAGE STRUCTURE

(75) Inventors: Thomas Matthew Gregorich, San Diego, CA (US); Tzu-Hung Lin, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 13/612,764

(22) Filed: Sep. 12, 2012

(65) Prior Publication Data
US 2013/0087911 A1 Apr. 11, 2013

Related U.S. Application Data

(60) Provisional application No. 61/544,808, filed on Oct. 7, 2011.

(51) Int. Cl.
*H01L 23/48* (2006.01)
*H01L 23/31* (2006.01)
(Continued)

(52) U.S. Cl.
CPC ..... *H01L 23/3128* (2013.01); *H01L 23/49838* (2013.01); *H01L 25/105* (2013.01); *H01L 23/49816* (2013.01); *H01L 2225/1005* (2013.01); *H01L 2225/1023* (2013.01); *H01L 2225/1058* (2013.01); *H01L 2924/0002* (2013.01); *H01L 2924/15192* (2013.01); *H01L 2924/15311* (2013.01); *H01L 2924/15321* (2013.01); *H01L 2924/15331* (2013.01); *H01L 2924/3511* (2013.01)

(58) Field of Classification Search
CPC ..... H01L 23/48; H01L 25/071; H01L 25/10; H01L 25/112; H01L 25/115; H01L 25/117; H01L 25/162; H01L 23/5385

USPC ........... 257/686, 723, 737, 778, E23.015, 257/E23.016, E23.021
See application file for complete search history.

(56) References Cited

U.S. PATENT DOCUMENTS

| | | | |
|---|---|---|---|
| 5,191,404 A * | 3/1993 | Wu et al. | 257/724 |
| 6,448,665 B1 * | 9/2002 | Nakazawa et al. | 257/789 |
| 6,475,830 B1 * | 11/2002 | Brillhart | 438/109 |

(Continued)

FOREIGN PATENT DOCUMENTS

| | | |
|---|---|---|
| CN | 100479152 | 4/2009 |
| CN | 102263074 | 11/2011 |
| WO | WO 2009/120482 | 10/2009 |

OTHER PUBLICATIONS

English language machine translation of CN 102263074 (published Nov. 30, 2011).

*Primary Examiner* — Peniel M Gumedzoe
(74) *Attorney, Agent, or Firm* — McClure, Qualey & Rodack, LLP

(57) ABSTRACT

An integrated circuit (IC) package structure is provided, including: a first integrated circuit (IC) package, including: a first package substrate, having opposite first and second surfaces, wherein a first semiconductor chip is disposed over a first portion of the first surface of the first package substrate. In addition, a second integrated circuit (IC) package is disposed on a second portion different from the first portion of the first surface of the first package substrate, including: a second package substrate, having opposite third and fourth surfaces, wherein a second semiconductor chip is disposed over a portion of the third surface of the second package substrate, and the second semiconductor chip has a function different from that of the first semiconductor chip.

9 Claims, 3 Drawing Sheets

(51) Int. Cl.
*H01L 25/10* (2006.01)
*H01L 23/498* (2006.01)

(56) References Cited

U.S. PATENT DOCUMENTS

| | | | | |
|---|---|---|---|---|
| 6,677,668 B1* | 1/2004 | Lin | ............................... | 257/685 |
| 7,838,335 B2* | 11/2010 | Hayashi et al. | ............. | 438/108 |
| 8,310,051 B2 | 11/2012 | Chen et al. | | |
| 8,456,856 B2* | 6/2013 | Lin et al. | ...................... | 361/783 |
| 2001/0015488 A1* | 8/2001 | Akram et al. | ................ | 257/686 |
| 2002/0060361 A1* | 5/2002 | Sasaki | .......................... | 257/698 |
| 2004/0099938 A1* | 5/2004 | Kang et al. | .................. | 257/686 |
| 2004/0104469 A1* | 6/2004 | Yagi et al. | .................... | 257/723 |
| 2004/0196682 A1* | 10/2004 | Funaba et al. | ................ | 365/149 |
| 2004/0222534 A1* | 11/2004 | Sawamoto et al. | ........... | 257/778 |
| 2004/0235221 A1* | 11/2004 | Taguchi et al. | ............... | 438/108 |
| 2004/0262777 A1 | 12/2004 | Kim et al. | | |
| 2005/0181543 A1* | 8/2005 | Lee et al. | ...................... | 438/127 |
| 2005/0230841 A1* | 10/2005 | Walk et al. | ................... | 257/778 |
| 2006/0006521 A1* | 1/2006 | Boon et al. | .................... | 257/701 |
| 2006/0264022 A1* | 11/2006 | Sugimura et al. | ............. | 438/613 |
| 2007/0096334 A1* | 5/2007 | Kawabata | ........... | H01L 25/0652 257/777 |
| 2008/0128888 A1 | 6/2008 | Park et al. | | |
| 2008/0157318 A1* | 7/2008 | Chow et al. | .................. | 257/686 |
| 2009/0206455 A1* | 8/2009 | Harper et al. | ................ | 257/659 |

* cited by examiner

INTEGRATED CIRCUIT PACKAGE STRUCTURE

CROSS REFERENCE TO RELATED APPLICATIONS

This application claims the benefit of U.S. Provisional Application No. 61/544,808 filed Oct. 7, 2011, the entirety of which is incorporated by reference herein.

BACKGROUND OF THE INVENTION

1. Field of the Invention

The present invention relates to an integrated circuit (IC) package structure, and in particular, to a side-by package-on-package (side-by POP) package structure comprising a plurality of semiconductor chips that are vertically and horizontally disposed over a package substrate.

2. Description of the Related Art

Electronic devices demand more integrated circuits to be packaged in an integrated circuit package with less physical space. Some technologies focus on integrating more functions into each integrated circuit. Other technologies focus on stacking these integrated circuits into a single package. While these approaches provide more functions within an integrated circuit, they do not fully address the requirements for lower heights, smaller sizes, and cost reductions.

Modern mobile electronic devices, such as smart phones, and personal digital assistants, are packing more integrated circuits into an ever-shrinking physical space with expectations for decreasing costs. Numerous technologies such as multi-chip package, package-in-package (PIP) have been developed to meet these requirements.

BRIEF SUMMARY OF THE INVENTION

An integrated circuit (IC) package structure is provided, comprising: a first integrated circuit (IC) package, comprising: a first package substrate, having opposite first and second surfaces, wherein a first semiconductor chip is disposed over a first portion of the first surface of the first package substrate. In addition, a second integrated circuit (IC) package is disposed on a second portion different from the first portion of the first surface of the first package substrate, comprising: a second package substrate, having opposite third and fourth surfaces, wherein a second semiconductor chip is disposed over a portion of the third surface of the second package substrate, and the second semiconductor chip has a function different from that of the first semiconductor chip.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
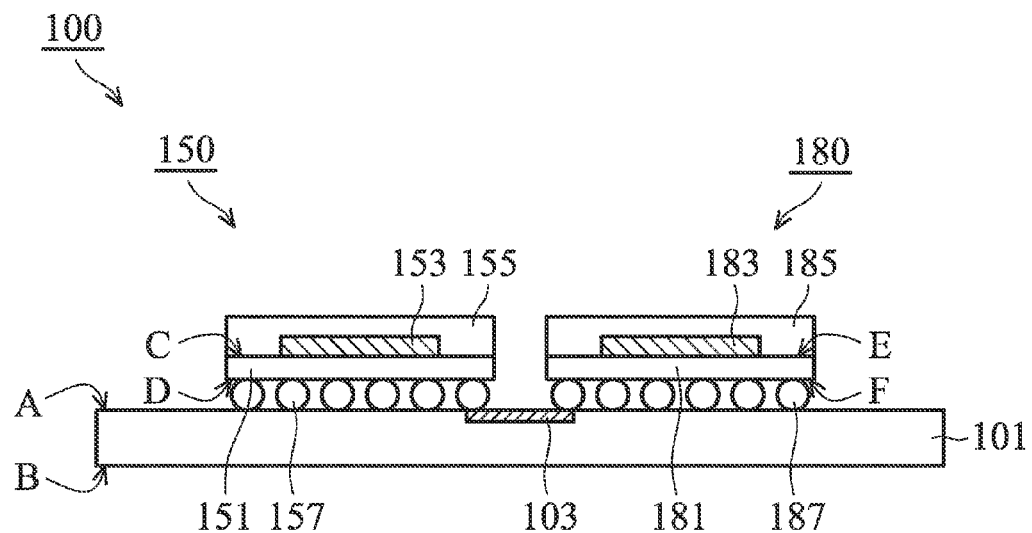
FIG. 1 is a schematic cross section showing an integrated circuit (IC) package structure according to an embodiment of the invention.
Figure 2:
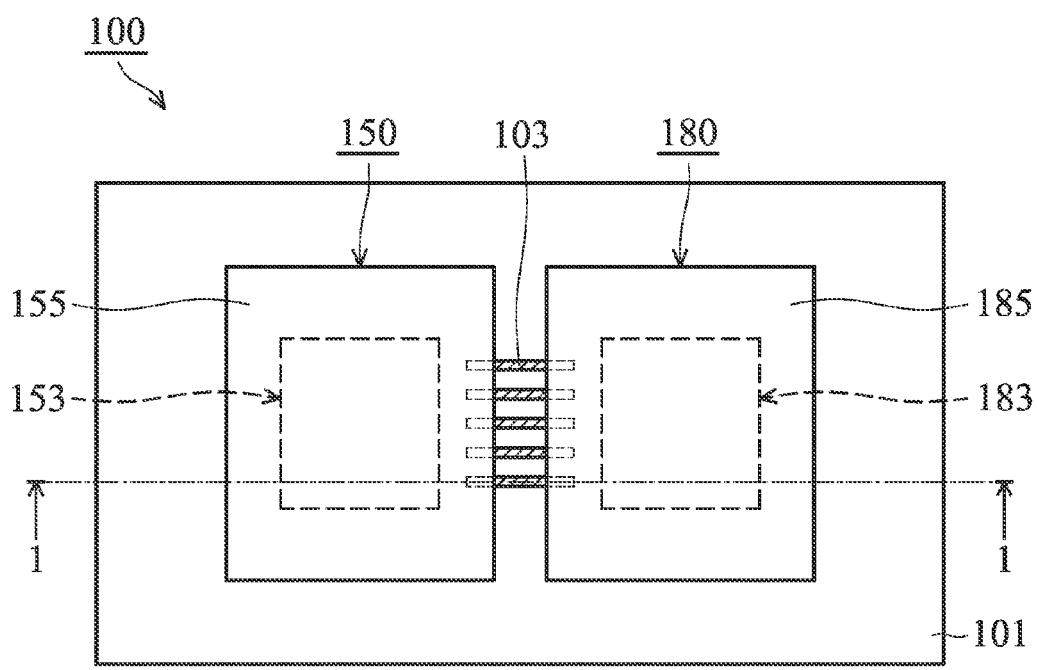
FIG. 2 is a schematic top view of the IC package structure shown in FIG. 1.
Figure 3:
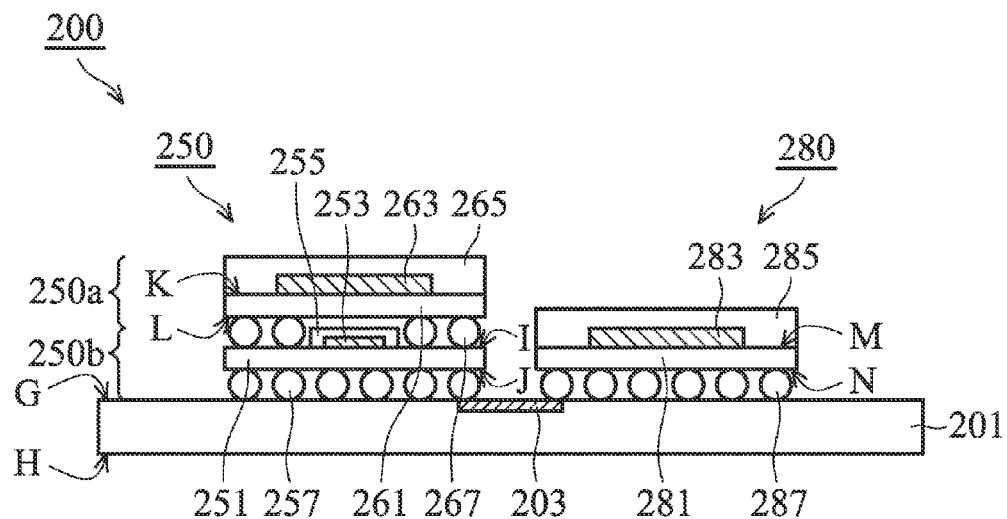
FIG. 3 is a schematic cross section showing an integrated circuit (IC) package structure according to another embodiment of the invention.
Figure 4:
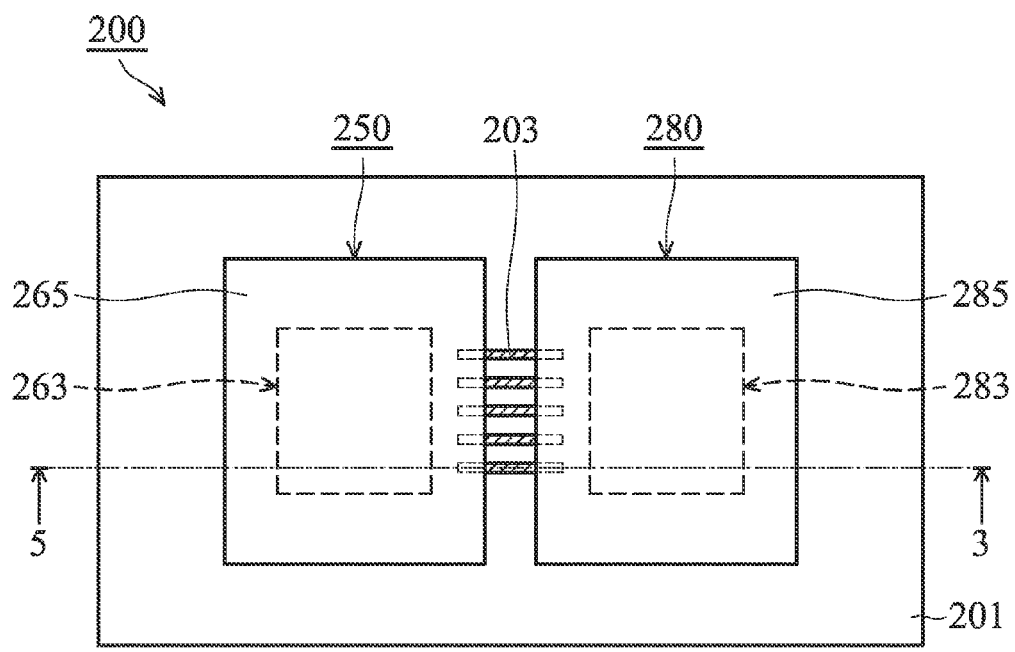
FIG. 4 is a schematic top view of the IC package structure shown in FIG. 3.

FIGS. 1-4 are schematic diagrams showing various exemplary integrated circuit (IC) package structures which may be applied in mobile electrical devices, wherein FIGS. 1 and 3 are schematic cross sections taken along lines 1-1 and 3-3 in FIGS. 2 and 4, respectively, and FIGS. 2 and 4 are schematic top views of the IC package structures shown in FIGS. 1 and 3, respectively. The exemplary IC package structures shown in FIGS. 1-4 are comparative embodiments for describing problems found by the inventors, and to not limit the scope of the present application.

In FIGS. 1 and 2, an exemplary IC package structure 100 having a side-by-side package configuration is illustrated. The IC package structure 100 comprises a printed circuit board (PCB) 101 having opposite surfaces A and B, and two individual integrated circuit (IC) packages 150 and 180 disposed over the surface A of the PCB 101. In addition, a plurality of conductive lines 103 is formed over a portion of the PCB 101.

As shown in FIGS. 1 and 2, the IC packages 150 and 180 are disposed over various portions of the surface A of the PCB 101, and the IC package 180 is located at a side of the IC package 150. The conductive lines 103 are formed as parallel conductive lines to function as a bus line to electrically connect the IC package 150 to the IC package 180.

In one embodiment, the IC package 150 comprises a package substrate 151 having opposite surfaces C and D, a semiconductor chip 153 disposed over the surface C of the package substrate 151, an encapsulant layer 155 covering the semiconductor chip 153 and the surface C of the package substrate 151, and a plurality of solder balls 157 disposed over the surface C of the package substrate 153 for electrical communication with landing pads (not shown) correspondingly formed over the surface A of the PCB 101. Similarly, the IC package 180 comprise a package substrate 181 having opposite surfaces E and F, a semiconductor chip 183 disposed over the surface E of the package substrate 181, an encapsulant layer 185 covering the semiconductor chip 183 and the surface E of the package substrate 181, and a plurality of solder balls 187 disposed over the surface F of the package substrate 181 for electrical communication with landing pads (not shown) correspondingly formed over the surface A of the PCB 101. The semiconductor chip 183 may have a function different from the semiconductor chip 153.

In one embodiment, the IC package substrate 100 is used in a mobile electronic device such as a mobile phone, a personal digital assistant (PDA), or the like. In this embodiment, the PCB 101 is a motherboard of the mobile electronic device, the semiconductor chip 153 is a logic chip such as a microprocessor, and the semiconductor chip 183 is an integrated memory chip comprising a non-volatile memory device such as an e-MMC™ memory device and a volatile memory device such as a low power dual data rate (LPDDR) memory device integrated in a single semiconductor chip. A bus speed of the volatile memory device (e.g. LPDDR device) in the semiconductor chip 183, however, is limited due to the connecting bus lines (e.g. the conductive lines 103) being designed to be formed in the motherboard (e.g. the PCB 101) of the mobile electrical device, thereby affecting operation efficiency of the IC package structure 100.

In FIGS. 3 and 4, an exemplary IC package structure 200 having a package-on-package (POP) package configuration is illustrated. The IC package structure 200 comprises a printed circuit board (PCB) 201 having opposite surfaces G and H, and two individual integrated circuit (IC) packages 250 and 280 are disposed over the surface G of the PCB 201. In addition, a plurality of conductive lines 203 is formed over a portion of the PCB 201.

As shown in FIGS. 3 and 4, the IC packages 250 and 280 are disposed over various portions over the surface G of the package substrate 201, the IC package 250 is provided with a package-on-package (POP) configuration, comprising two sub-packages 250a and 250b sequentially stacked over the PCB 201, and the IC package 280 is located at a side of the IC package 250. The conductive lines 203 are formed as parallel conductive lines for functioning as a bus line to electrically connect the IC package 250 to the IC package 280.

As shown in FIG. 3, the sub-package 250a of the IC package 250 is stacked over a portion of the PCB 201, comprising a package substrate 251 having opposite surfaces I and J, a semiconductor chip 253 disposed over the surface I of the package substrate 251, an encapsulant layer 255 covering the semiconductor chip 253 and the surface I of the package substrate 251, and a plurality of solder balls 257 disposed over the surface J of the package substrate 253 for electrical communication with landing pads (not shown) corresponding formed over the surface A of the PCB 201. In addition, the sub-package 250b is stacked over the surface I of the package substrate PCB 201, comprising a package substrate 261 having opposite surfaces K and L, a semiconductor chip 263 disposed over the surface K of the package substrate 261, an encapsulant layer 265 covering the semiconductor chip 263 and the surface K of the package substrate 261, and a plurality of solder balls 267 disposed over the surface L of the package substrate 263 for electrical communication with landing pads (not shown) correspondingly formed over the surface I of the package substrate 251. The sub-package 250b of the IC package 250 is isolated from the encapsulant layer 255 the sub-package 250a, and the solder balls 267 are disposed over the surface I of the package substrate 251 from at least two sides around the semiconductor chip 253. Similarly, the IC package 280 comprise a package substrate 281 having opposite surfaces M and N, a semiconductor chip 283 disposed over the surface M of the package substrate 281, an encapsulant layer 285 covering the semiconductor chip 283 and the surface N of the package substrate 281, and a plurality of solder balls 287 disposed over the surface N of the package substrate 281 for electrical communication with landing pads (not shown) correspondingly formed over the surface G of the PCB 201. The semiconductor chips 253, 263, and 283 may have different functionalities.

In one embodiment, the IC package substrate 200 is used in a mobile electronic device such as a mobile phone, a personal digital assistant (PDA), or the like. In this embodiment, the PCB 201 is a motherboard of the mobile electronic device, the semiconductor chip 253 is a microprocessor, the semiconductor chip 263 is a volatile memory device such as a low power dual data rate (LPDDR) memory device, and the semiconductor chip 283 is a memory chip such as a non-volatile memory device such as an e-MMC™ memory device. Although a limitation of the bus speed of the volatile memory device of the semiconductor chip 263 can be resolved by directly packaging the semiconductor chip 263 over the semiconductor chip 253. However, thermal dissipation of the semiconductor chip 253 and package warpage issues of the package substrates 251 and 261 arise in the IC package 250, thereby affecting reliability of the IC package structure 200.

Figure 5:
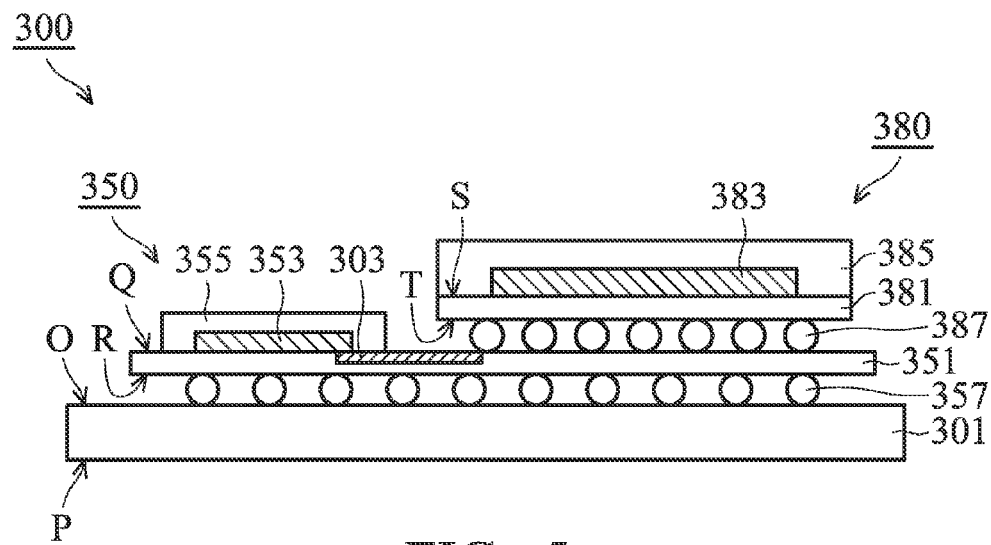
FIG. 5 is a schematic cross section showing an integrated circuit (IC) package structure according to yet another embodiment of the invention.
Figure 6:
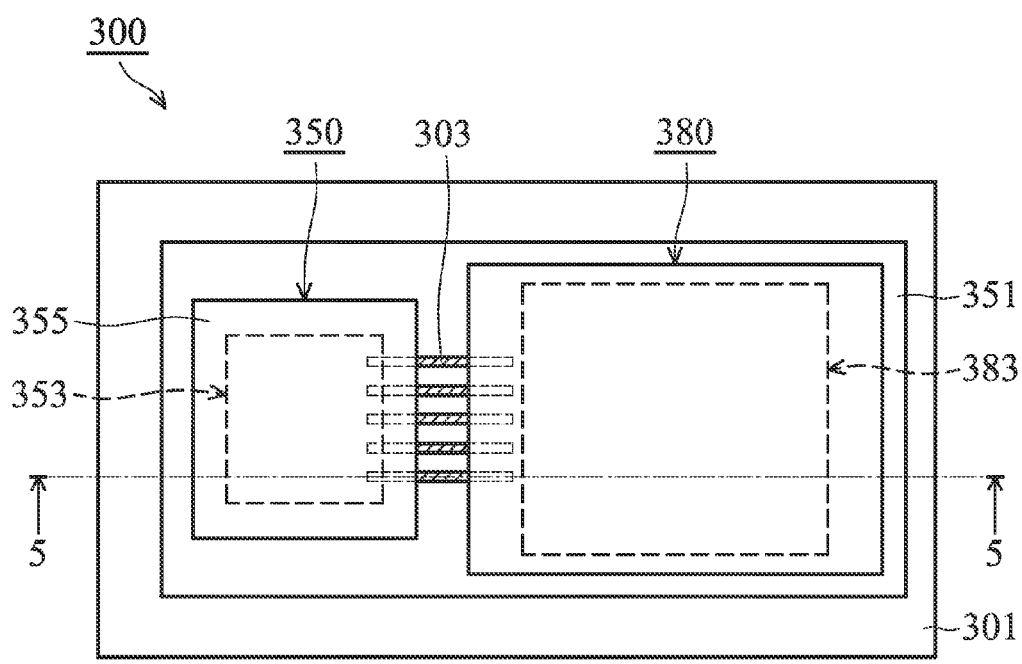
FIG. 6 is a schematic top view of the IC package structure shown in FIG. 5.

Therefore, an improved IC package 300 is provided through illustrations in FIGS. 5 and 6 to overcome the above drawbacks of the IC packages 100 and 200 disclosed above, wherein FIG. 5 is a schematic cross section taken along lines 5-5 in FIG. 6, and FIG. 6 is a schematic top view of the IC package structure shown in FIG. 5.

In FIGS. 5 and 6, an exemplary IC package structure 300 having both side-by-side and package-on-package (POP) package configurations is illustrated. The IC package structure 300 comprises a printed circuit board (PCB) 301 having opposite surfaces O and P, and an integrated circuit (IC) package 350 is disposed over the surface O of the PCB 301, and another IC package 380 is disposed over a portion of the IC package 350.

In one embodiment, the IC package 350 comprises a package substrate 351 having opposite surfaces Q and R, a semiconductor chip 353 disposed over a portion of the surface Q of the package substrate 351, an encapsulant layer 355 covering the semiconductor chip 353 and a portion of the surface Q of the package substrate 351, and a plurality of solder balls 357 disposed over the surface Q of the package substrate 353 for electrical communication with landing pads (not shown) correspondingly formed over the surface O of the PCB 301. In addition, the IC package 380 is disposed over a portion of the surface Q not covered by the encapsulant layer 355 from a side of the semiconductor chip 353, and a plurality of conductive lines 303 is formed over a portion of the package substrate 351. Similarly, the IC package 380 comprises a package substrate 381 having opposite surfaces S and T, a semiconductor chip 383 disposed over the surface S of the package substrate 381, an encapsulant layer 385 covering the semiconductor chip 383 and the surface S of the package substrate 381, and a plurality of solder balls 387 disposed over the surface T of the package substrate 381 for electrical communication with landing pads (not shown) correspondingly formed over the surface Q of the package substrate 351. The semiconductor chip 383 may have a function different from the semiconductor chip 353. The conductive lines 303 are formed as parallel conductive lines for functioning as a bus line to electrically connect the semiconductor chip 353 in the IC package 350 to the IC package 380.

In one embodiment, the IC package substrate 300 is used in a mobile electronic device such as a mobile phone, a personal digital assistant (PDA), or the like. In this embodiment, the PCB 301 is a motherboard of the mobile electronic device, the semiconductor chip 353 is a logic chip such as a microprocessor, and the semiconductor chip 383 is an integrated memory chip comprising a non-volatile memory device such as an e-MMC™ memory device and a volatile memory device such as a low power dual data rate (LPDDR) memory device integrated in a single semiconductor chip.

Compared with the IC package structure 100 shown in FIGS. 1 and 2, since the semiconductor chip 353 is electrically connected to the semiconductor chip 383 in the IC package 380 through the bus lines (e.g. the conductive lines 303) formed in the package substrate 351 of the IC package 350 rather than that formed in the PCB 101 shown in FIGS. 1 and 2, a limitation of the bus speed of the volatile memory device of the semiconductor chip 363 can be resolved. Design and fabrication of bus lines (e.g. the conductive lines 303) formed in the package substrate 351 of the IC package 350 are also easier than that formed in the PCB 101 shown in FIGS. 1 and 2.

Moreover, compared with the IC package structure 200 shown in FIGS. 3 and 4, since the encapsulant layer 355 is now exposed and no other IC package is formed thereover, thermal dissipation of the semiconductor chip 353 is not an issue for the IC package 350.

Accordingly, operation efficiency and reliability of the IC package structure 300 can be thus improved when compared with that of the IC package structures 100 and 200 shown in FIGS. 1-4.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC) package structure, comprising:
   a first integrated circuit (IC) package, comprising:
   a first sub-package, comprising:
   a first package substrate, having opposite first and second surfaces;
   a first semiconductor chip disposed over a first portion of the first surface of the first package substrate;
   an encapsulant layer disposed over top and sidewall surfaces of the first semiconductor chip and the first portion of the first surface of the first package substrate; and
   a plurality of first solder bumps disposed over the second surface of the first package substrate; and
   a second sub-package stacked on top of the first sub-package, the second sub-package comprising:
   a second package substrate, having opposite third and fourth surfaces;
   a second semiconductor chip disposed over a portion of the third surface of the second package substrate, wherein the second semiconductor chip has a function different from that of the first semiconductor chip; and
   a plurality of second solder bumps disposed between the fourth surface of the second package substrate and the first surface of the first package substrate;
   a printed circuit board (PCB), having opposite fifth and sixth surfaces, wherein the first IC package is disposed over the fifth surface of the PCB and electrically connected to the first IC package via the plurality of first solder bumps;
   a second IC package disposed over the fifth surface of the PCB; and
   a plurality of bus lines formed in the fifth surface of the PCB electrically connecting the first semiconductor chip to the second IC package such that the first sub-package, the second sub-package, and the second IC package are configured in a side-by package on package (side-by POP) IC package structure;
   wherein the first semiconductor chip is a microprocessor chip, and the second semiconductor chip is an integrated chip comprising a volatile memory device.

2. The IC package structure as claimed in claim 1, wherein the second semiconductor chip comprises an LPDDR memory device.

3. The IC package structure as claimed in claim 1, wherein the second IC package comprises a non-volatile memory device.

4. The IC package structure as claimed in claim 3, wherein the non-volatile memory device comprises an eMMC™ memory device.

5. An integrated circuit (IC) package structure, comprising:
   a printed circuit board (PCB);
   a first integrated circuit (IC) package disposed over and electrically connected to the PCB, the first IC package comprising:
   a first sub-package, comprising:
   a first package substrate, having opposite first and second surfaces;
   a first semiconductor chip disposed over a first portion of the first surface of the first package substrate;
   an encapsulant layer disposed over top and sidewall surfaces of the first semiconductor chip and the first portion of the first surface of the first package substrate; and
   a plurality of first solder bumps disposed over the second surface of the first package substrate; and
   a second sub-package stacked on top of the first sub-package, the second sub-package comprising:
   a second package substrate, having opposite third and fourth surfaces;
   a second semiconductor chip disposed over a portion of the third surface of the second package substrate, wherein the second semiconductor chip has a function different from that of the first semiconductor chip; and
   a plurality of second solder bumps disposed directly on the first surface of the first package substrate and outside the first portion of the first surface where the first semiconductor chip is disposed;
   a second IC package disposed over the PCB; and
   a plurality of bus lines formed in the PCB electrically connecting the first IC package to the second IC package such that the first sub-package, the second sub-package, and the second IC package are configured in a side-by package on package (side-by POP) IC package structure.

6. The IC package structure as claimed in claim 5, wherein the first semiconductor chip is a microprocessor chip, and the second semiconductor chip is an integrated chip comprising a volatile memory device.

7. The IC package structure as claimed in claim 6, wherein the second semiconductor chip comprises an LPDDR memory device.

8. The IC package structure as claimed in claim 5, wherein the second IC package comprises a non-volatile memory device.

9. The IC package structure as claimed in claim 8, wherein the non-volatile memory device comprises an eMMC™ memory device.

* * * * *